US012235289B2

(12) United States Patent
Taoka et al.

(10) Patent No.: US 12,235,289 B2
(45) Date of Patent: Feb. 25, 2025

(54) CURRENT SENSOR HAVING SHIELDING ARRANGEMENT

(71) Applicant: Alps Alpine Co., Ltd., Tokyo (JP)

(72) Inventors: Takahiro Taoka, Miyagi-ken (JP); Chiaki Ueda, Miyagi-ken (JP); Manabu Tamura, Miyagi-Ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 92 days.

(21) Appl. No.: 18/081,489

(22) Filed: Dec. 14, 2022

(65) Prior Publication Data

US 2023/0111157 A1 Apr. 13, 2023

Related U.S. Application Data

(63) Continuation of application No. PCT/JP2021/023978, filed on Jun. 24, 2021.

(30) Foreign Application Priority Data

Jul. 28, 2020 (JP) ................. 2020-127451

(51) Int. Cl.
*G01R 15/20* (2006.01)
(52) U.S. Cl.
CPC ................. *G01R 15/207* (2013.01)
(58) Field of Classification Search
CPC .... G01R 15/207; G01R 15/202; G01R 33/07; G01R 19/0092; G01R 33/0005; G01R 33/0047; G01R 33/12; G01R 33/075; G01R 33/385; G01R 1/04; G01R 11/04; G01R 31/3275; G01R 1/18; G01D 11/245;

(Continued)

(56) References Cited

U.S. PATENT DOCUMENTS 9,091,708 B2 * 7/2015 Kawaguchi ........ G01R 19/0092
9,417,269 B2   8/2016 Sakai et al.
(Continued)

FOREIGN PATENT DOCUMENTS

JP      5482736     2/2014
JP    2016/3974     1/2016
(Continued)

OTHER PUBLICATIONS

International Search Report, International Application No. PCT/JP2021/023978, Dated Jun. 24, 2021.

*Primary Examiner* — Vinh P Nguyen
(74) *Attorney, Agent, or Firm* — Beyer Law Group LLP

(57) ABSTRACT

A current sensor includes a magnetic sensor configured to detect a magnetic field generated by a current to be measured flowing through a current path and a shielding member including a first shield, a second shield, and a third shield disposed away from each other. The first shield is disposed on an opposite side of the current path from the magnetic sensor in a first direction in which the magnetic sensor and the current path oppose each other and includes a first opposing surface opposing the current path. The second shield includes a second opposing surface along the first direction. The third shield includes a third opposing surface along the first direction. The second shield and the third shield are disposed such that the second opposing surface and the third opposing surface oppose each other, with the magnetic sensor and the current path sandwiched therebetween.

6 Claims, 8 Drawing Sheets

(58) Field of Classification Search
CPC .... G01D 11/24; H05K 9/0075; H05K 9/0003;
H05K 7/18; H05K 7/1417; H05K 9/0007;
H05K 9/0024; H05K 1/0222; H05K 5/04;
H05K 3/284
See application file for complete search history.

(56) References Cited

U.S. PATENT DOCUMENTS

| | | |
|---|---|---|
| 9,465,054 B2 | 10/2016 | Sakamoto et al. |
| 10,317,432 B2 | 6/2019 | Sakamoto et al. |
| 10,634,702 B2 | 4/2020 | Sei et al. |
| 2019/0361055 A1* | 11/2019 | Hebiguchi ......... G01R 19/0092 |
| 2020/0271696 A1* | 8/2020 | Nakada ................. G01R 31/42 |
| 2021/0063446 A1* | 3/2021 | Miyamoto ........... G01R 15/205 |
| 2021/0293858 A1* | 9/2021 | Takahashi ................ G01R 3/00 |
| 2024/0147681 A1* | 5/2024 | Chen .................... H05K 9/0032 |

FOREIGN PATENT DOCUMENTS

| | | |
|---|---|---|
| JP | 5993966 | 8/2016 |
| JP | 2016/164523 | 9/2016 |
| JP | 6030866 | 10/2016 |
| JP | 2017/78577 | 4/2017 |
| JP | 6372969 | 7/2018 |
| JP | 2018/189503 | 11/2018 |
| JP | 2020/67271 | 4/2020 |
| WO | 2016/098511 | 6/2016 |

\* cited by examiner

CURRENT SENSOR HAVING SHIELDING ARRANGEMENT

CLAIM OF PRIORITY

This application is a Continuation of International Application No. PCT/JP2021/023978 filed on Jun. 24, 2021, which claims benefit of Japanese Patent Application No. 2020-127451 filed on Jul. 28, 2020. The entire contents of each application noted above are hereby incorporated by reference.

BACKGROUND OF THE INVENTION

1. Field of the Invention

The present invention relates to a current sensor that detects a current to be measured on the basis of a magnetic field generated by the current flowing through a current path.

2. Description of the Related Art

A current sensor disclosed in Japanese Unexamined Patent Application Publication No. 2016-3974 is configured such that a current path through which a current to be measured flows is bent in a U-shape, the opposite ends of the current path are disposed in contact with the opposing long sides of an insulative rectangular substrate, and one side of the ends of the current path is in the vicinity of one short side of the insulative substrate. A magnetic-field control plate that controls the magnetic field generated by the current to be measured is bent in a U-shape, one end of which is disposed in contact with the one of the short sides of the insulative substrate at which the side of the current path is located. A magnetic sensor element that measures the magnetic field is disposed at the center of the opening width of the magnetic-field control plate. The magnetic-field control plate allows concentrating the magnetic field generated from the current path to the periphery of the magnetic sensor element and reducing external magnetic fields to magnetically shield the magnetic sensor element.

The current sensor disclosed in Japanese Unexamined Patent Application Publication No. 2016-3974 amplifies a magnetic field generated by the current to be measured using the magnetic-field control plate while preventing the effect of external magnetic fields using the magnetic-field control plate serving as a shielding member. This allows the magnetic field to be reliably detected by the magnetic sensor element disposed at the center of the opening width of the magnetic-field control plate. However, the magnetic-field control plate is likely to reach magnetic saturation, although having the effect of amplifying the magnetic field. This makes it impossible for the current sensor to detect current, posing the problem of impairing the function as a current sensor.

SUMMARY OF THE INVENTION

The present invention provides a current sensor including a shielding member capable of sufficiently attenuating external magnetic fields and reducing or controlling magnetic saturation, thereby expanding the current measurement range, for example, the current measurement range of the current to be measured and the measurable frequency band.

A current sensor according to an aspect of the present invention includes a magnetic sensor configured to detect a magnetic field generated by a current to be measured flowing through a current path and a shielding member including a first shield, a second shield, and a third shield disposed away from each other, wherein the first shield is disposed on an opposite side of the current path from the magnetic sensor in a first direction in which the magnetic sensor and the current path oppose each other and includes a first opposing surface opposing the current path, wherein the second shield includes a second opposing surface along the first direction, wherein the third shield includes a third opposing surface along the first direction, and wherein the second shield and the third shield are disposed such that the second opposing surface and the third opposing surface oppose each other, with the magnetic sensor and the current path sandwiched therebetween.

The configuration in which a shield surrounding a bus bar through which the current to be measured flows is composed of a plurality of discontinuous members allows reducing or controlling magnetic saturation in the shield while reducing the effect of external magnetic fields, thereby expanding the current measurement range.

In the current sensor according to an aspect of the invention, preferably, ends of the second shield and the third shield adjacent to the first shield are closer to the magnetic sensor than the first opposing surface of the first shield in the first direction.

This allows reducing the effect of external magnetic fields effectively. In particular, in the case where a current sensor with the same configuration is arranged next thereto in the second direction in which the second opposing surface and the third opposing surface oppose each other, a magnetic field generated by a current flowing through the adjacent bus bar can be efficiently blocked, and the effect of the magnetic field on the magnetic sensor can be reduced.

In the current sensor according to an aspect of the invention, preferably, ends of the first shield adjacent to the second shield and the third shield in a second direction in which the second opposing surface and the third opposing surface oppose each other are disposed farther from the magnetic sensor than the second opposing surface and the third opposing surface.

This allows reducing the effect of external magnetic fields effectively. In particular, this allows reliably reducing the effect of external magnetic fields along the first direction in which the magnetic sensor and the current path oppose each other using the first shield.

In the current sensor according to an aspect of the invention, preferably, the current path extends in a third direction perpendicular to the first direction and the second direction, and respective opposite ends of the second shield and the third shield in the third direction are located outside the first shield as viewed along the first direction.

This allows supporting the first shield independently of supporting the second shield and the third shield in insert molding, thereby enhancing ease of assembly.

In the current sensor according to an aspect of the invention, preferably, the first shield, the second shield, and the third shield are individually divided.

This allows the shield to be divided in a form suitable for reducing the effect of various external magnetic fields. This allows reducing the effect of the external magnetic fields effectively, thereby adjusting the current measurement range.

DESCRIPTION OF THE PREFERRED EMBODIMENTS

Figure 1A:
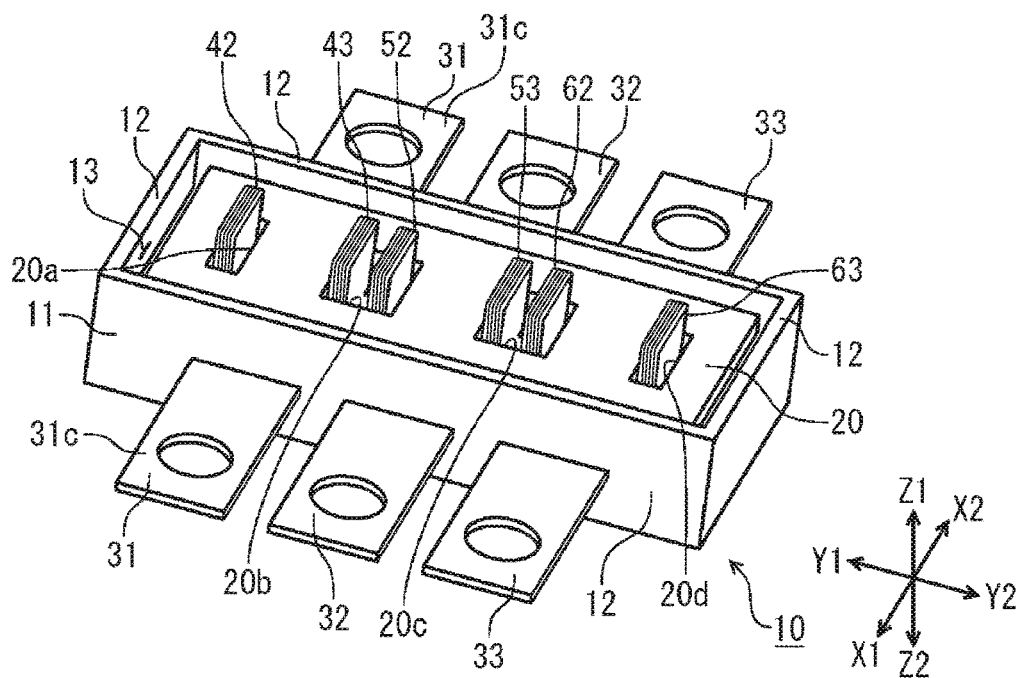
FIG. 1A is a perspective view of a current sensor according to a first embodiment of the present invention illustrating the configuration thereof.

Current sensors according to embodiments of the present invention will be described in detail hereinbelow with reference to the drawings. The drawings show the X-Y-Z coordinates as reference coordinates. In the following description, the Z1-Z2 direction is referred to as a vertical direction (a first direction), the X1-X2 direction is referred to as a front-back direction (a third direction), and the Y1-Y2 direction is referred to as a lateral direction (a second direction). The X1-X2 direction and the Y1-Y2 direction are perpendicular to each other, and an X-Y plane containing the X1-X2 direction and the Y1-Y2 direction is perpendicular to the Z1-Z2 direction. The state seen from above (Z1 side) to below (Z2 side) is sometimes referred to as a plan view.

First Embodiment

Referring to FIGS. 1A and 1B, FIGS. 2A and 2B, or FIGS. 3A and 3B, a current sensor 10 according to a first embodiment includes a base member 11, a substrate 20, three magnetic sensors 21, 22, and 23, three bus bars 31, 32, and 33 serving as current paths, three first shields 41, 51, and 61, three second shields 42, 52 and 62, and three third shields 43, 53, and 63.

Figure 4A:
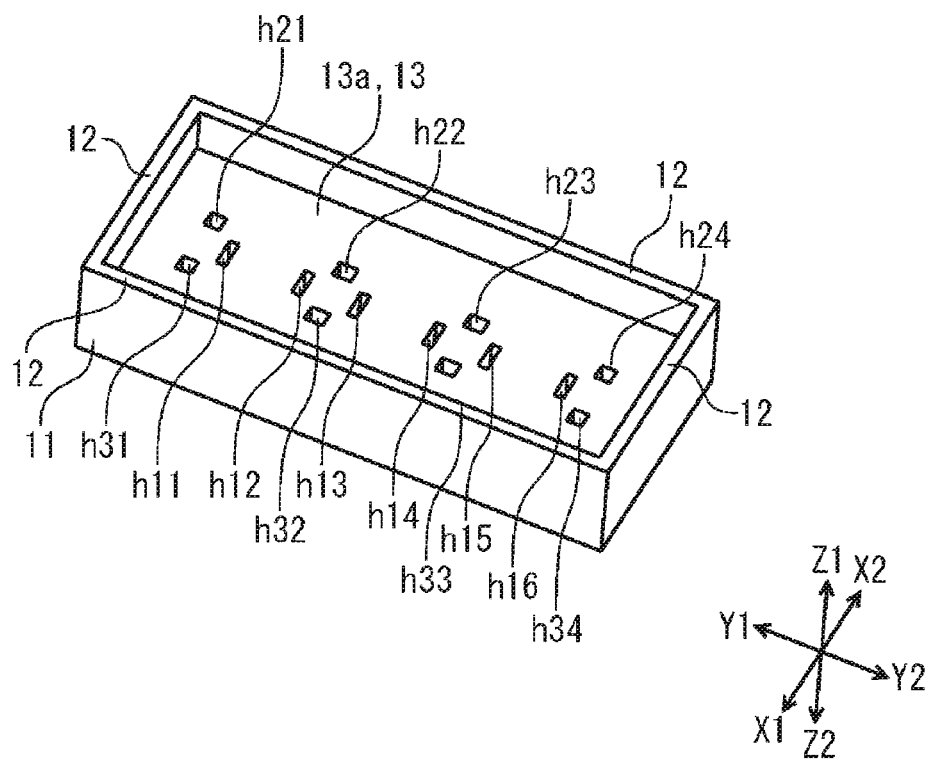
FIG. 4A is a perspective view of the base member seen from above.
Figure 4B:
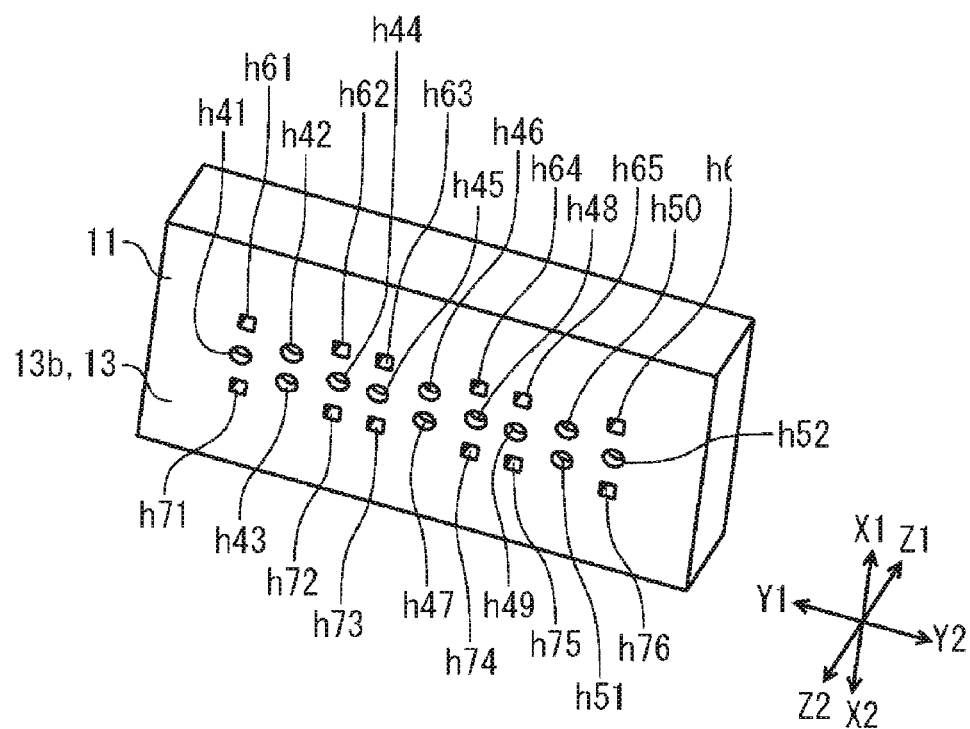
FIG. 4B is a perspective view of the base member seen from below.

The base member 11 is made of a nonmagnetic material insert-molded together with the three bus bars 31, 32, and 33, the three first shields 41, 51, and 61, the three second shields 42, 52, and 62, and the three third shields 43, 53, and 63. The base member 11 has a rectangular outer shape extending in the lateral direction (Y1-Y2 direction) in plan view seen from above (Z1 side) to below (Z2 side). The outer shape is formed of four outer walls 12 corresponding to the four sides of the rectangle. Inside the four outer walls 12 in plan view, a base 13 recessed downward is provided, as shown in FIG. 4A. Because of this, the upper surface 13a of the base 13 is located below the upper surfaces of the outer walls 12. In contrast, the bottom surface 13b of the base 13 forms a plane integral to the outer walls 12, as shown in FIG. 4B.

Figure 1B:
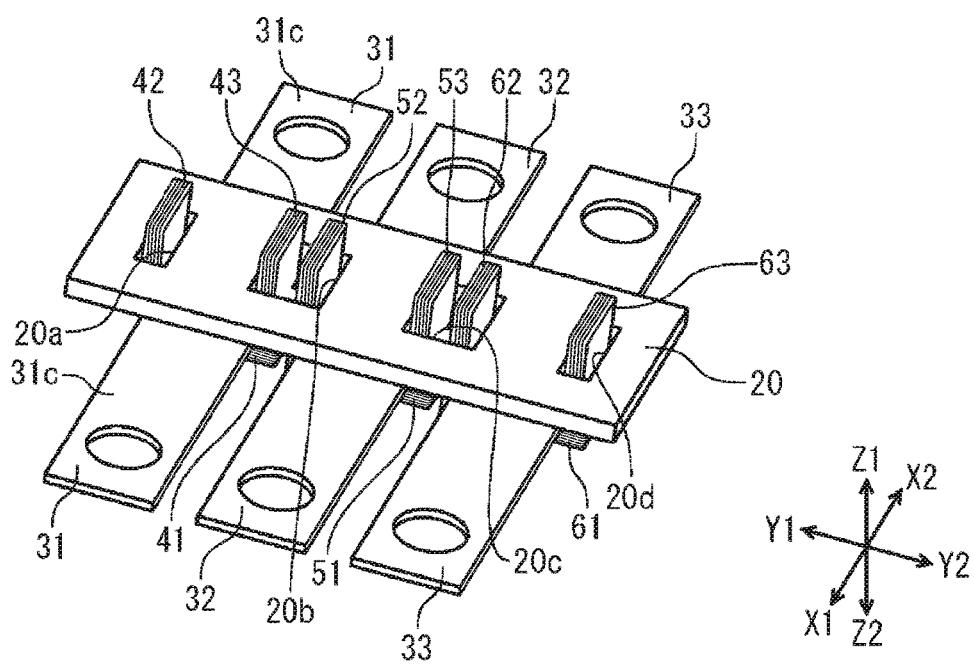
FIG. 1B is a perspective view of the current sensor shown in FIG. 1A in which the base member is omitted.
Figure 2A:
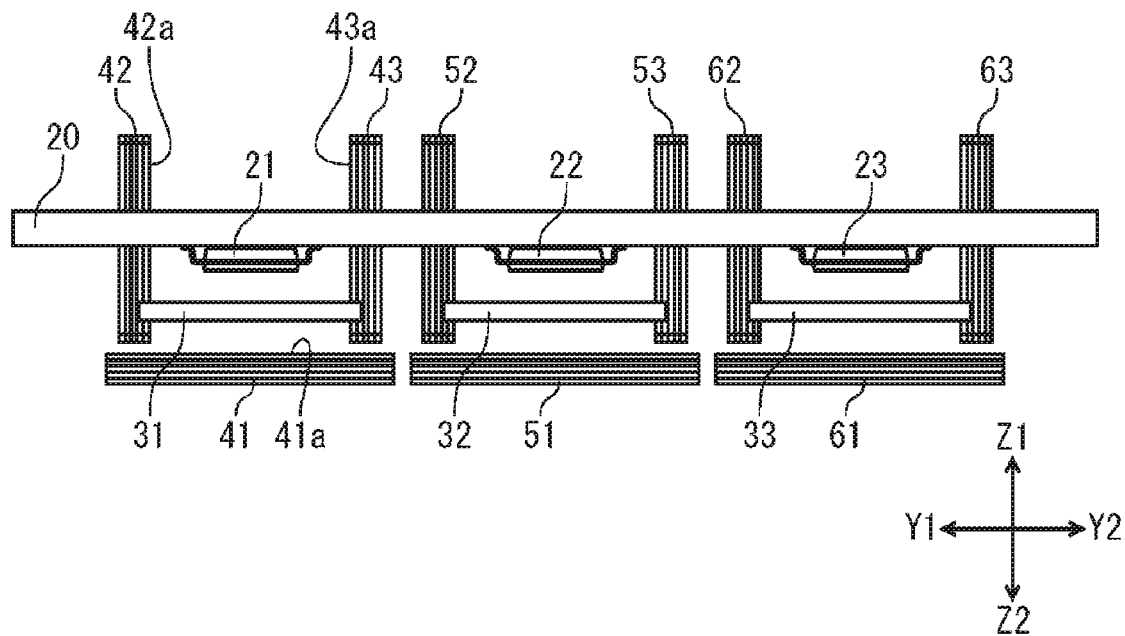
FIG. 2A is a front view of FIG. 1B seen from the front.

As shown in FIGS. 1A and 1B and FIG. 2A, the substrate 20 is a rectangular plate in plan view extending in the lateral direction (Y1-Y2 direction) and disposed inside the four outer walls 12 of the base member 11 and above the base 13. The substrate 20 has a first insertion-hole 20a, a second insertion-hole 20b, a third insertion-hole 20c, and a fourth insertion-hole 20d from left to right in order so as to pass through in the thickness direction (the vertical direction, or the Z1-Z2 direction). The first insertion-hole 20a is disposed so that the leftmost second shield 42 can be vertically inserted. The second insertion-hole 20b is disposed so that the third shield 43 facing the second shield 42 and the second shield 52 can be inserted in spaced-apart relationship. The third insertion-hole 20c is disposed so that the third shield 53 facing the second shield 52 and the second shield 62 can be inserted in spaced-apart relationship. The fourth insertion-hole 20d is disposed so that the rightmost third shield 63 can be inserted.

Figure 3A:
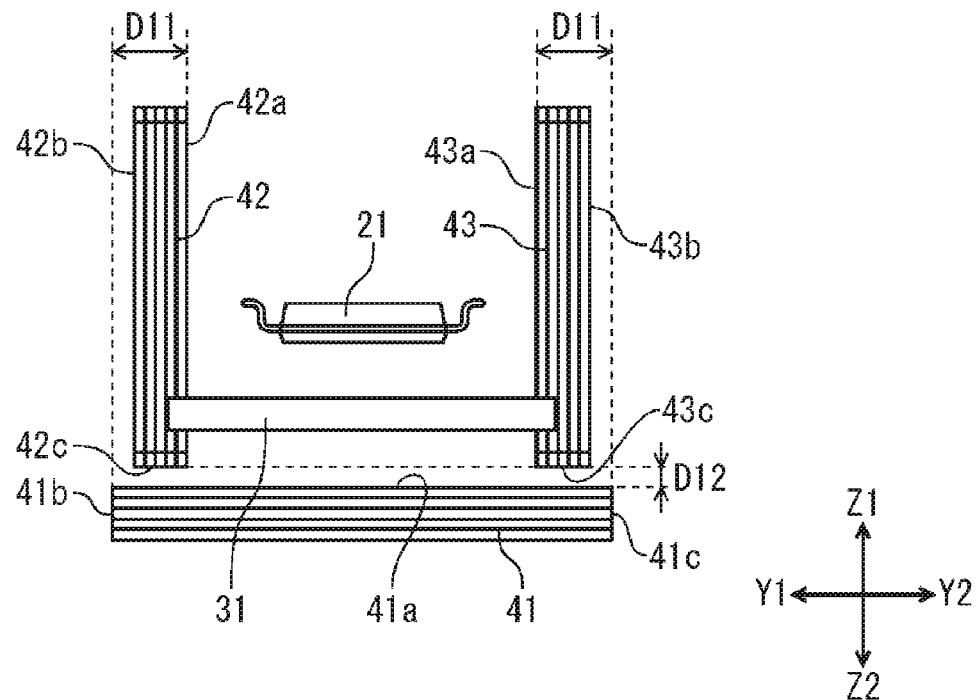
FIG. 3A is an enlarged front view of a bus bar on the left in FIG. 2A, a magnetic sensor corresponding thereto, and the first shield, the second shield, and the third shield surrounding them illustrating the arrangement thereof.
Figure 3B:
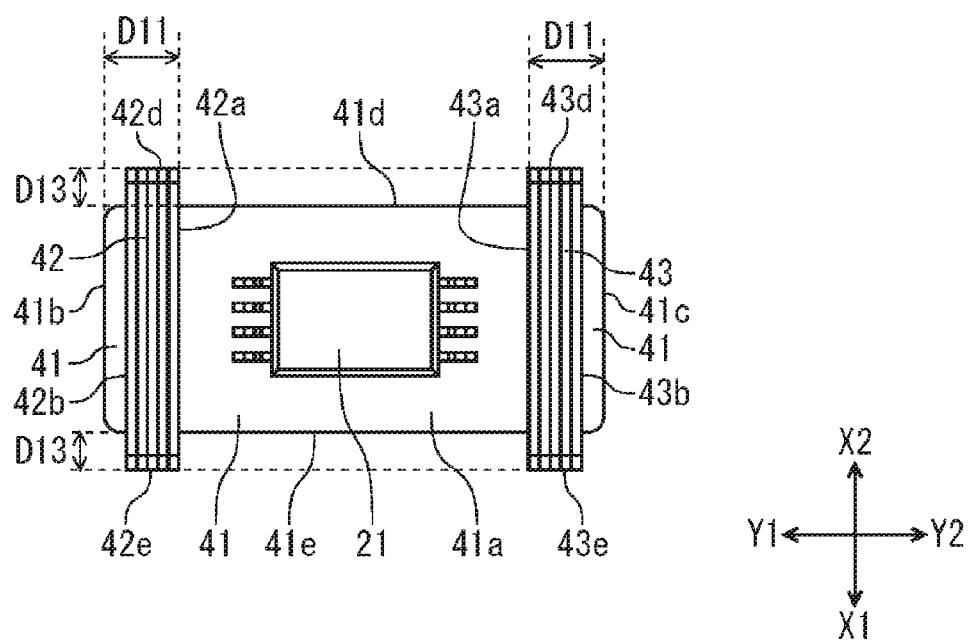
FIG. 3B is a plan view of FIG. 3A in which the bus bar is omitted.

As shown in FIG. 2A, the three magnetic sensors 21, 22, and 23 are disposed on the lower surface of the substrate 20 from left to right. As shown in FIG. 2A and FIGS. 3A and 3B, the first magnetic sensor 21 on the left is disposed at an intermediate position between a pair of shields 42 and 43 (the second shield 42 and the third shield 43) in the lateral direction and above the first shield 41 and the first bus bar 31 located above the first shield 41 in the vertical direction.

Like the first magnetic sensor 21, the second magnetic sensor 22 is disposed at an intermediate position between a pair of shields 52 and 53 (the second shield 52 and the third shield 53) in the lateral direction and above the first shield 51 and the second bus bar 32 located above the first shield 51 in the vertical direction. The third magnetic sensor 23 is also disposed, as is the first magnetic sensor 21, at an intermediate position between a pair of shields 62 and 63 (the second shield 62 and the third shield 63) in the lateral direction and above the first shield 61 and the third bus bar 33 located above the first shield 61 in the vertical direction.

The three bus bars 31, 32, and 33 serving as current paths have the same long plate shape extending in the front-back direction (X1-X2 direction) and are disposed such that the upper and lower surfaces are perpendicular to the vertical direction. As shown in FIG. 2A, the respective upper surfaces of the three bus bars 31, 32, and 33 face the three magnetic sensors 21, 22, and 23, respectively, and the respective lower surfaces face the three first shields 41, 51, and 61, respectively. More specifically, in the vertical direction, the first bus bar 31 on the left is disposed between the magnetic sensor 21 on the left and the first shield 41 on the left so as to face each other, the second bus bar 32 at the center in the lateral direction is disposed between the second magnetic sensor 22 at the center and the first shield 51 at the center so as to face each other, and the bus bar 33 on the right is disposed between the third magnetic sensor 23 on the right and the first shield 61 on the right so as to face each other.

Figure 2B:
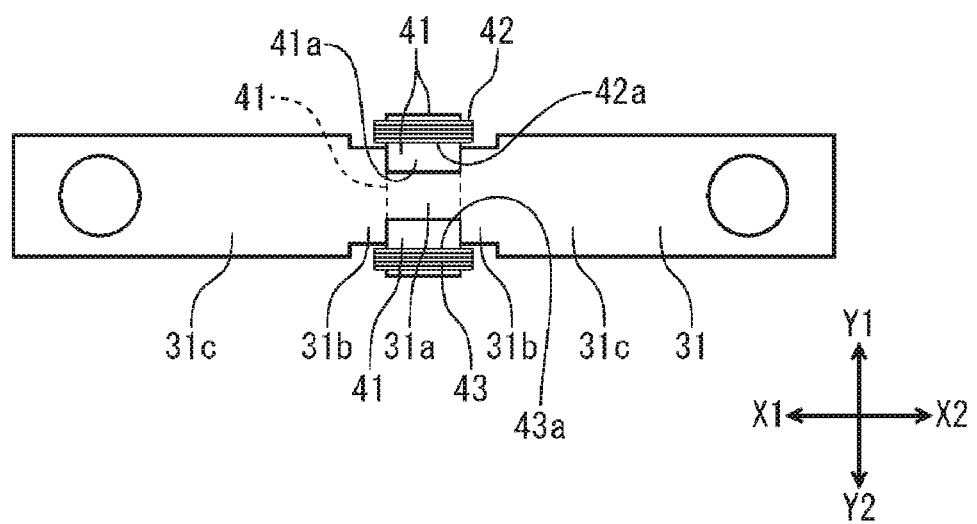
FIG. 2B is a plan view of the bus bar on the right in FIG. 2A, and a first shield, a second shield, and a third shield surrounding them illustrating the arrangement thereof.

As shown in FIG. 2B, the first bus bar 31 on the left includes a rectangular central portion 31a at the center in the longitudinal direction (the front-back direction, or the X1-X2 direction), two intermediate portions 31b extending from the outer opposite ends of the central portion 31a in the longitudinal direction, and two external portions 31c extending from the outer opposite ends of the two intermediate portions 31b in the longitudinal direction. The first bus bar 31 has a symmetrical shape in the width direction (the lateral direction, or the Y1-Y2 direction), of which the intermediate portions 31b are wider than the central portion 31a, and the external portions 31c are wider than the intermediate portions 31b. The planar shape of the first bus bar 31 is the same as those of the second bus bar 32 and the third bus bar 33.

Next, for the first, second, and third shields, the set of the first shield 41 on the left and the second shield 42 and the third shield 43 corresponding thereto will be described by way of example. The set of the first shield 51, second shield 52, and the third shield 53 at the center in the lateral direction and the set of the first shield 61, the second shield 62, and the third shield 63 on the right also have the same configuration.

The number of sets of the first, second, and third shields and combinations of the bus bar and the magnetic sensor corresponding thereto of the current sensor is not limited to three, as shown in FIGS. 1A and 1B. The number may be, for example, one, two, or four or more.

As shown in FIG. 2A and FIG. 3A, the first shield 41, the second shield 42, and the third shield 43 have a configuration in which five magnetic-shielding plates made of the same magnetic material are stacked. These shields 41, 42, and 43 are preferably made of a soft magnetic material, for example, a magnetic steel sheet or a permalloy. The second shield 42 and the third shield 43 have the same shape.

The first shield 41 is disposed so as to extend in the lateral direction (Y1-Y2 direction), the upper surface of which, a first opposing surface 41a, opposes the lower surface of the first bus bar 31. As shown in FIG. 2B, the first shield 41 opposes the central portion 31a of the first bus bar 31.

The second shield 42 and the third shield 43 are disposed at the same height in the vertical direction so as to oppose each other in the lateral direction (Y1-Y2 direction). Thus, the second opposing surface 42a of the second shield 42 and the third opposing surface 43a of the third shield 43 oppose each other.

As shown in FIG. 3A, the opposite end faces 41b and 41c of the first shield 41 are located outside the outer surface 42b of the second shield 42 and the outer surface 43b of the third shield 43 in the lateral direction (Y1-Y2 direction). Specifically, the left end face 41b of the first shield 41 (the end adjacent to the second shield 42) is located to the left by a distance D11 relative to the second opposing surface 42a of the second shield 42, and the right end face 41c (the end adjacent to the third shield 43) is located to the right by a distance D11 relative to the third opposing surface 43a of the third shield 43. The distance D11 is larger than the lateral thickness of the second shield 42 and the third shield 43. For this reason, the end (the first end face 41b) of the first shield 41 adjacent to the second shield 42 and the end (the second end face 41c) adjacent to the third shield 43 are respectively positioned farther from the magnetic sensor 21 than the second opposing surface 42a and the third opposing surface 43a in the lateral direction.

Disposing the opposite ends of the first shield 41 outside the outer surface 42b of the second shield 42 and the outer surface 43b of the third shield 43 in the lateral direction allows reducing the effect of external magnetic fields present in the vicinity, including a magnetic field generated by the current to be measured flowing through the adjacent second bus bar 32.

The lower surface 42c of the second shield 42 and the lower surface 43c of the third shield 43 are spaced apart from the first opposing surface 41a of the first shield 41 by a distance D12 in the vertical direction (Z1-Z2 direction). In other words, the ends of the second shield 42 and the third shield 43 adjacent to the first shield 41 are closer to the magnetic sensor 21 than the first opposing surface 41a of the first shield 41 in the vertical direction (the first direction). The distance D12 is set so as to interrupt external magnetic fields to the magnetic sensor 21 surrounded by the first shield 41, the second shield 42, and the third shield 43 to reduce the external magnetic fields within a predetermined range and to become unlikely to reach magnetic saturation in a manner that depends on the specifications of the current sensor 10 and its operating environment.

Disposing the second shield 42 and the third shield 43 away from the first shield 41 by the distance D12 allows reducing the effect of external magnetic fields present in the vicinity, including a magnetic field generated by the current to be measured flowing through the adjacent second bus bar 32.

As shown in FIG. 3B, the opposite end faces 42d and 42e of the second shield 42 are located outside the opposite end faces 41d and 41e of the first shield 41, respectively, by a distance D13 in the front-back direction (X1-X2 direction). Likewise, the opposite end faces 43d, 43e of the third shield 43 are located outside the opposite end faces 41d and 41e of the first shield 41, respectively, by a distance D13. In other words, the opposite ends (the opposite end faces 42d and 42e) of the second shield 42, and the opposite ends (the opposite end faces 43d and 43e) of the third shield 43 in the front-back direction (the third direction) are located outside the first shield 41 in the vertical direction (the first direction).

Disposing the opposite ends of the second shield 42 and the third shield 43 outside the opposite ends of the first shield 41 in the front-back direction allows holding the first shield 41, the second shield 42, and the third shield 43 individually in insert molding, facilitating manufacture with high positional accuracy.

Referring to FIGS. 4A and 4B, FIG. 5, and FIG. 6, the manufacture of the current sensor 10 will be described. The base member 11, the three bus bars 31, 32, and 33, the three first shields 41, 51, and 61, the three second shields 42, 52, and 62, and the three third shields 43, 53, and 63 are manufactured using insert molding.

As shown in FIGS. 4A and 4B, the base 13 of the base member 11 has bottomed upper presser holes h11 to h16, h21 to h24, and h31 to h34 from the upper surface 13a downward and bottomed lower presser holes h41 to h52, h61 to h66, h71 to 76 from the bottom surface 13b upward. These upper and lower presser holes are used to hold the first shield 41, the second shield 42, and the third shield 43 by pressing pins because the first shield 41, the second shield 42, and the third shield 43 need to be positioned at predetermined positions in the mold in insert-molding so as to integrate the bus bars 31, 32, and 33, the first shield 41, the second shield 42, the third shield 43, and the base member 11. Removing the pins after the insert-molding forms the upper and lower presser holes h11 to h16, h21 to h24, h31 to h34, h41 to h52, h61 to h66, and h71 to 76 at the pressed positions.

For the upper presser holes in the upper surface 13a, the first upper presser holes h11, h12, h13, h14, h15, and h16 are formed from left to right in order at the center in the front-back direction. The second upper presser holes h21, h22, h23, and h24 are provided from left to right in order on the back of the first upper presser holes h11 to h16. The third upper presser holes h31, h32, h33, and h34 are provided from left to right in order at the positions corresponding to the second upper presser holes h21 to h24 closer to the front side than the first upper presser holes h11 to h16 in the front-back direction.

For the lower presser holes in the bottom surface 13b, the first lower presser holes h41, h42, h43, h44, h45, h46, h47, h48, h49, h50, h51, and h52 are formed from left to right in order at the center in the front-back direction. Among them, the three pairs of presser holes h42 and h43, h46 and h47, and h50 and h51 are each disposed in symmetry in the front-back direction. Among the first lower presser holes, the second lower presser holes h61, h62, h63, h64, h65, and h66 are formed from left to right in order at positions closer to the front side than the presser holes h41, h44, h45, h48, h49, and h52, and on the back, the third lower presser holes h71, h72, h73, h74, h75, and h76 are formed from left to right in order at the positions corresponding to the second lower presser holes h61 to h66 in the front-back direction.

Figure 5:
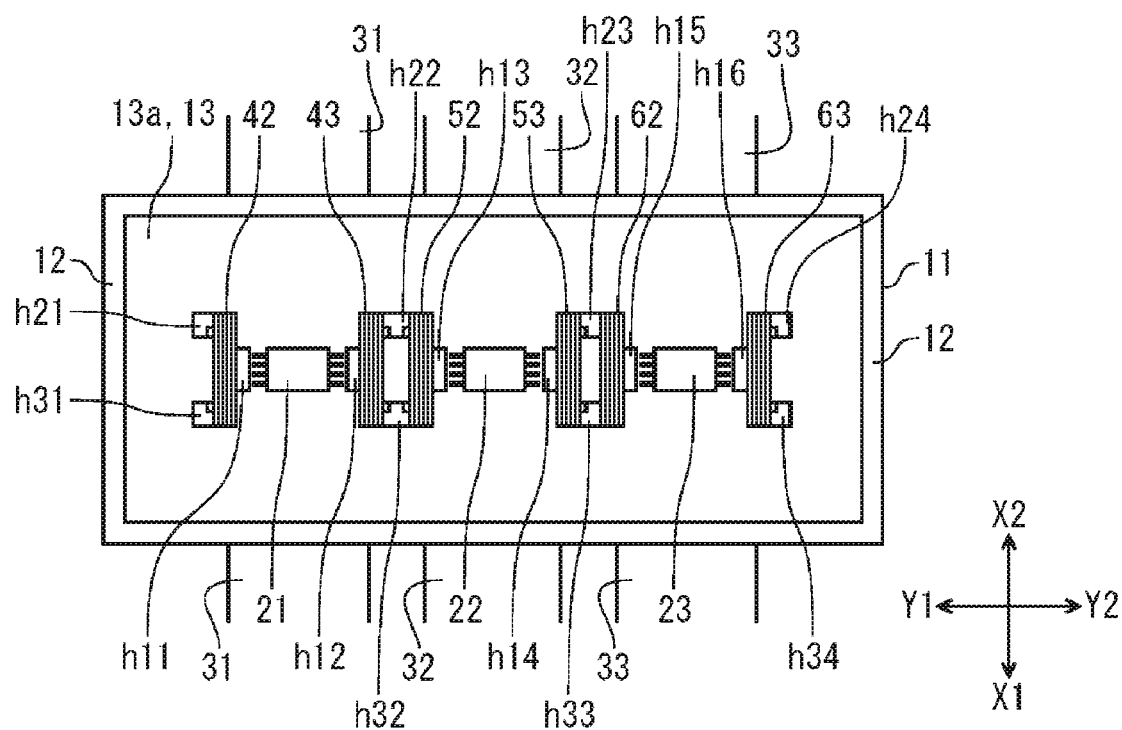
FIG. 5 is a plan view of the base member, the second shield and the third shield, and the magnetic sensor illustrating the arrangement thereof.

In insert molding, pins (not shown) for positioning the second shield 42 and the third shield 43 in an X-Y plane are disposed at the positions at which the upper presser holes h11 to h16, h21 to h24, and h31 to h34 are formed after completion of molding, and after completion of molding, the pins are removed (see FIG. 5). Marks where the pins are removed serve as the presser holes. As shown in FIG. 5, for example, for the leftmost second shield 42, the left side surface is restricted by a pin disposed at the position of the back presser hole h21 and a pin disposed at the position of the front upper presser hole h31, and the right side surface (the second opposing surface 42a) is restricted by a pin disposed at the position of the central presser hole h11 in the front-back direction.

Figure 6:
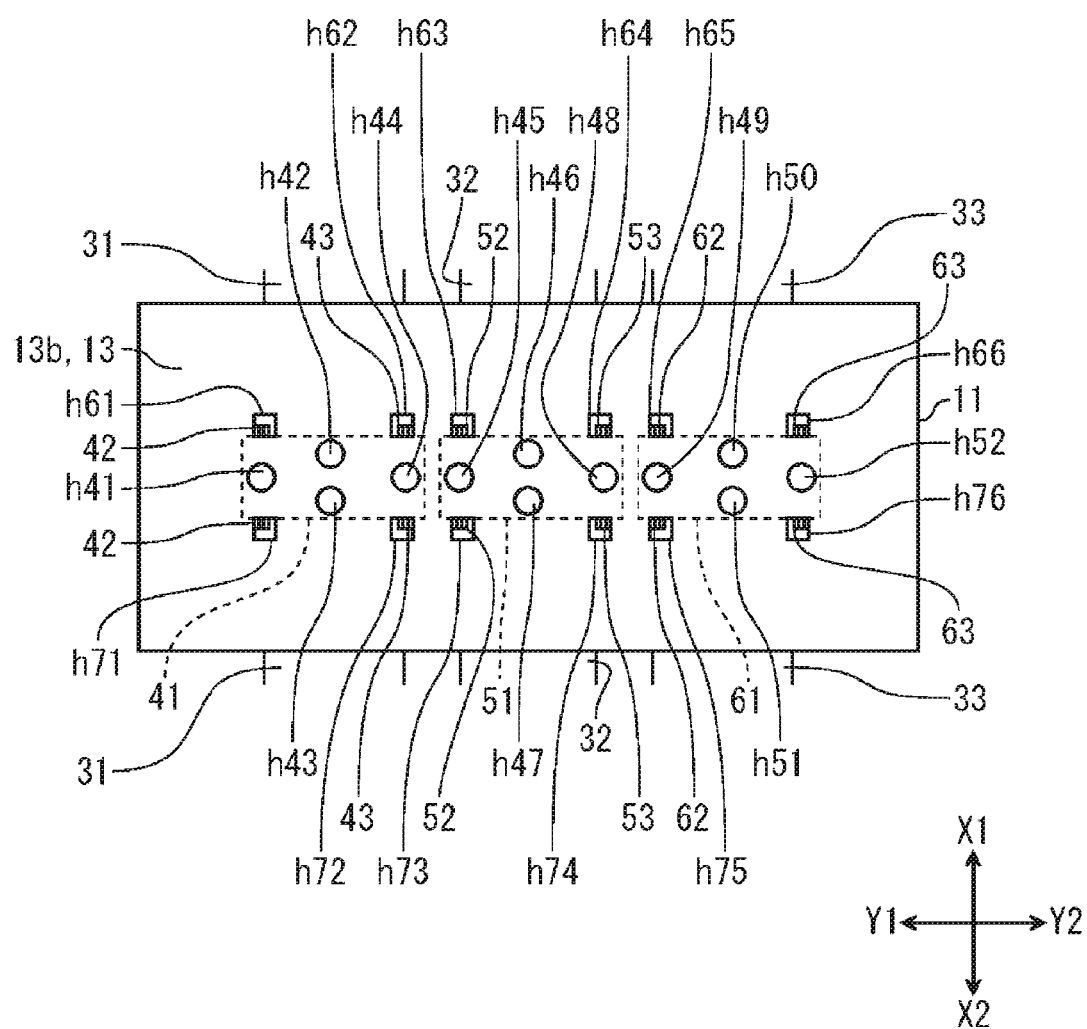
FIG. 6 is a bottom view of the base member in which the second shield and the third shield are disposed illustrating the position of the first shield in phantom.

For the lower presser holes, pins for vertically positioning the first shields 41, 51, and 61 are disposed at the positions where the first lower presser holes h41, h42, h43, h44, h45, h46, h47, h48, h49, h50, h51, h52 are to be formed, and the pins are removed after completion of molding (see FIG. 6). The marks formed after the pins are removed serve as the various presser holes. For example, the first shield 41 on the left is positioned by the pins disposed at the positions of the four first lower presser holes h41, h42, h43, h44 on the left shown in FIG. 6.

The second lower presser holes h61 to h66 are located closer to the front side than the first shields 41, 51, and 61, and the third lower presser holes h71 to h76 are located on the back of the first shields 41, 51, and 61. For the lower presser holes h61 to h66 and h71 to h76, pins for vertically positioning the second shield 42 and the third shield 43 are disposed, and the pins are removed after completion of molding. For example, the leftmost second shield 42 is vertically positioned by the pins disposed in the second lower presser hole h61 and the third lower presser hole h71 corresponding thereto in the front-back direction.

After completion of insert-molding, the positioning pins are removed, and the upper presser holes h11 to h16, h21 to h24, and h31 to h34 and the lower presser holes h41 to h52, h61 to h66, and h71 to 76 are formed at the positions where the pins are removed. Thereafter, the substrate 20 is disposed on the base 13. The substrate 20 is disposed so that the leftmost second shield 42 is positioned in the first insertion-hole 20a, the third shield 43 and the second shield 52 on the right are positioned in the second insertion-hole 20b so as to be parallel to each other, the third shield 53 and the second shield 62 on the right are positioned in the third insertion-hole 20c so as to be parallel to each other, and the rightmost third shield 63 is positioned in the fourth insertion-hole 20d.

Before the substrate 20 is disposed on the base 13, the three magnetic sensors 21, 22, and 23 are disposed on the lower surface of the substrate 20.

In the current sensor 10 of the first embodiment, the magnetic sensor 21 and the first bus bar 31 facing each other in the vertical direction are sandwiched between the second shield 42 and the third shield 43 in the lateral direction and is surrounded by the first shield 41 on the lower side, and the first opposing surface 41a of the first shield 41 is spaced apart from the second shield 42 and the third shield 43 by the distance D12. With this configuration, when the current to be measured flows through the first bus bar 31 serving as a current path, a magnetic field is generated, and the three shields 41, 42, and 43 surrounding the first bus bar 31 from three directions function as a yoke against the magnetic field. The three shields 41, 42, and 43 are spaced apart from each other by the distance D12. The distance D12 allows for controlling concentration of the magnetic force, thereby preventing the three shields 41, 42, and 43 from reaching magnetic saturation. This makes it possible to expand the current measurement range, for example, the current measurement range of the current to be measured and the measurable frequency band.

The result of a simulation of Example 1 based on the configuration of the current sensor 10 according to the first embodiment will be described.

The configurations of Example 1 and a comparative example are as follows.

EXAMPLE 1

The first shield 41 is made of a soft magnetic material, such as a magnetic steel sheet or a permalloy, and has a five-laminate structure with a total thickness of 1.5 mm (Z1-Z2 direction), a width of 13 mm (Y1-Y2 direction), and a length of 6 mm (X1-X2 direction). The second shield 42 is made of a soft magnetic material, such as a magnetic steel sheet or a permalloy, and has a five-laminate structure with a total thickness of 1.5 mm (Y1-Y2 direction), a height of 9.5 mm (Z1-Z2 direction), and a length of 8 mm (X1-X2 direction). The third shield 43 is made of the same material and has the same shape as those of the second shield 42. The distance D11 is 2 mm, the distance D12 is 0.5 mm, and the distance D13 is 1 mm. The first bus bar 31 is disposed 1.5 mm above from the first opposing surface 41a of the first shield 41, and the magnetic sensor 21 is disposed higher than that.

COMPARATIVE EXAMPLE

A shield in a comparative example has a continuous U-shape that is open at the top as viewed from the front and is not divided as are the first, second, and third shields in Example 1. The material and the length (X1-X2 direction) of the shield is the same as those of Example 1, and the thickness and the width (or the height) of portions corresponding to the first, second, and third shields of Example 1 are the same as those of the corresponding shields in Example 1. The shapes of the magnetic sensor and the bus bar and their positions relative to the inner surface (opposing surface) of the shielding member are the same as those of Example 1.

This simulation showed that, as shown in Table 1, in the comparative example, the maximum magnetic flux density was 1.6 T, and the effect of the adjacent bus bar was 0.1%, while, in Example 1, the maximum magnetic flux density was 0.4 T, and the effect of the adjacent bus bar was 0.7%.

The effect of the adjacent busbar in the comparative example was 0.1%, while the effect in Example 1 was 0.7%, the value of which was slightly greater than that of the comparative example. However, this is because the shield was divided to form a gap, so that the magnetic sensor was prone to be affected by the adjacent shield. For this reason, this is acceptable for the actual product. In other words, the degree of effect is not so high that it has a significant effect on the measurement accuracy of the current sensor 10 and is acceptable when reduction of magnetic saturation is prioritized. In Example 1, the current that flows until magnetic saturation was reached was about twice that of the comparative example. This showed that the configuration of Example 1 allowed expanding the current measurement range and amplifying the magnetic field generated by the current to be measured flowing through the bus bar 31 with the first shield 41, the second shield 42, and the third shield 43 serving as a yoke while sufficiently reducing the effect of external magnetic fields including a magnetic field generated by the current flowing through the adjacent bus bar.

TABLE 1

|  | Comparative Example | Example 1 | Example 2 | Example 3 |
| --- | --- | --- | --- | --- |
| Maximum Magnetic Flux Density (in T) | 1.6 | 0.4 | 0.8 | 0.6 |
| Effect from Neighborhood (in %) | 0.1 | 0.7 | 0.3 | 1.6 |

A modification will be described hereinbelow. The configurations of the first, second, and third shields can be freely set according to the specifications of the current sensor 10. For example, the number of laminates may be any number other than 5, or alternatively, a single layer is possible. One or more of the first, second, and third shields may be further divided. Such a change of the configurations allows controlling the measurement range according to, for example, the specifications of the current sensor while reducing the effect of external magnetic fields.

Second Embodiment

Figure 7A:
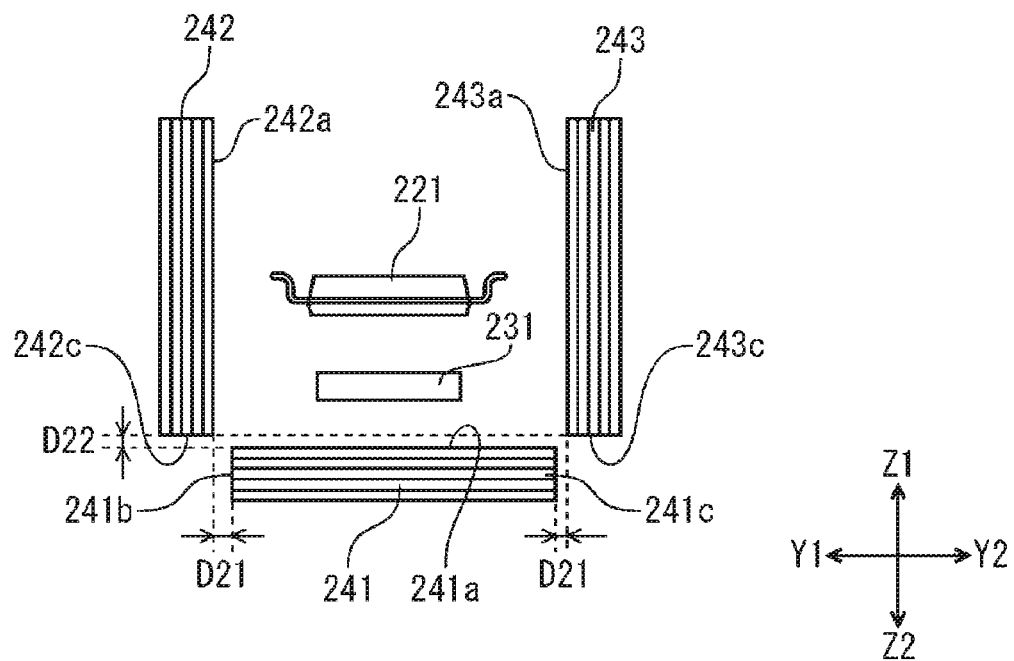
FIG. 7A is an enlarged front view of a bus bar, a magnetic sensor corresponding thereto, and a first shield, a second shield, and a third shield surrounding them in a second embodiment illustrating the arrangement thereof.

In a second embodiment shown in FIG. 7A, the opposite end faces 241b and 241c of a first shield 241 are disposed at positions closer to a magnetic sensor 221, that is, inner than a second opposing surface 242a of a second shield 242 and a third opposing surface 243a of a third shield 243 in the lateral direction (the second direction). A bus bar 231 is disposed between the magnetic sensor 221 and the first shield 241 in the vertical direction (Z1-Z2 direction), and the upper and lower surfaces face them, respectively, as in the first embodiment. The other configurations are the same as those of the first embodiment, and a detailed description will be omitted.

The left end face 241b of the first shield 241 and the second opposing surface 242a are spaced apart by a distance D21 in the lateral direction. The right end face 241c of the first shield 241 and the third opposing surface 243a are also spaced apart by the distance D21. A first opposing surface 241a, which is the upper surface of the first shield 241, is spaced apart from the lower surface 242c of the second shield 242 and the lower surface 243c of the third shield 243 by a distance D22 in the vertical direction.

A simulation was performed for Example 2 of the current sensor according to the second embodiment with the following configuration.

EXAMPLE 2

The first shield 241 is made of a soft magnetic material, such as a magnetic steel sheet or a permalloy, and has a five-laminate structure with a total thickness of 1.5 mm (Z1-Z2 direction), a width of 8 mm (Y1-Y2 direction), and a length of 6 mm (X1-X2 direction). The second shield 242 is made of a soft magnetic material, such as a magnetic steel sheet or a permalloy, and has a five-laminate structure with a total thickness of 1.5 mm (Y1-Y2 direction), a height of 9.5 mm (Z1-Z2 direction), and a length of 6 mm (X1-X2 direction). The third shield 243 is made of the same material and has the same shape as those of the second shield 242. The distance D21 is 0.5 mm, and the distance D22 is 0.5 mm. The bus bar 231 is disposed 1.5 mm above from the first opposing surface 241a of the first shield 241, and the magnetic sensor 221 is disposed higher than that.

This simulation showed that, as shown in Table 1, in Example 2, the maximum magnetic flux density was 0.8 T, and the effect of the adjacent bus bar was 0.3%. In Example 2, the current that flows until magnetic saturation was reached was about four times that of the comparative example. This showed that the configuration of Example 2 in which the lateral size is smaller than that of Example 1 (the first embodiment) allowed expanding the current measurement range and amplifying the magnetic field generated by the current to be measured flowing through the bus bar 231 with the first shield 241, the second shield 242, and the third shield 243 serving as a yoke while sufficiently reducing the effect of external magnetic fields including a magnetic field generated by the current flowing through the adjacent bus bar.

Third Embodiment

Figure 7B:
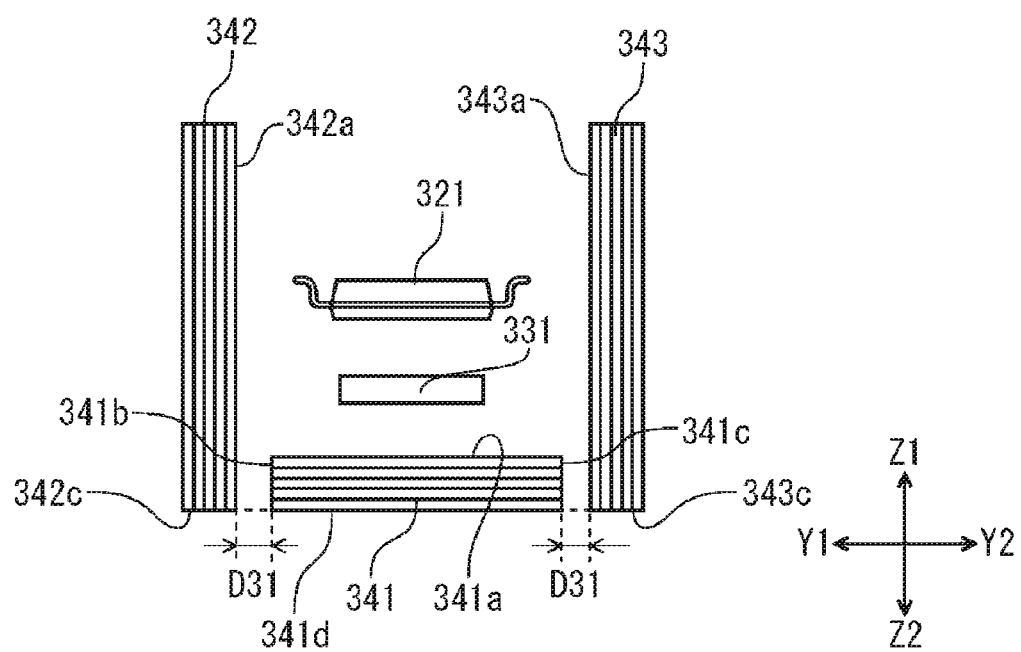
FIG. 7B is an enlarged front view of a bus bar, a magnetic sensor corresponding thereto, and a first shield, a second shield, and a third shield surrounding them in a third embodiment illustrating the arrangement thereof.

In a third embodiment shown in FIG. 7B, the opposite end faces 341b and 341c of a first shield 341 are disposed at positions closer to a magnetic sensor 321, that is, inner than a second opposing surface 342a of a second shield 342 and a third opposing surface 343a of a third shield 343 in the lateral direction (the second direction). A bus bar 331 is disposed between the magnetic sensor 321 and the first shield 341 in the vertical direction (Z1-Z2 direction), and the upper and lower surfaces face them, respectively, as in the first embodiment. The other configurations are the same as those of the first embodiment, and a detailed description will be omitted.

The left end face 341b of the first shield 341 and the second opposing surface 342a are spaced apart by a distance D31 in the lateral direction. The right end face 341c of the first shield 341 and the third opposing surface 343a are also spaced apart by the distance D31. The lower surface 341d of the first shield 341 is disposed at the same positions in the vertical direction as those of the lower surface 342c of the second shield 342 and the lower surface 343c of the third shield 343.

A simulation was performed for Example 3 of the current sensor according to the third embodiment with the following configuration.

EXAMPLE 3

The first shield 341 is made of a soft magnetic material, such as a magnetic steel sheet or a permalloy, and has a five-laminate structure with a total thickness of 1.5 mm (Z1-Z2 direction), a width of 7 mm (Y1-Y2 direction), and a length of 6 mm (X1-X2 direction). The second shield 342 is made of a soft magnetic material, such as a magnetic steel sheet or a permalloy, and has a five-laminate structure with a total thickness of 1.5 mm (Y1-Y2 direction), a height of 11.5 mm (Z1-Z2 direction), and a length of 6 mm (X1-X2 direction). The third shield 343 is made of the same material and has the same shape as those of the second shield 342. The distance D31 is 1 mm. The bus bar 331 is disposed 1.5 mm above from the first opposing surface 341a of the first shield 341, and the magnetic sensor 321 is disposed higher than that.

This simulation showed that, as shown in Table 1, in Example 3, the maximum magnetic flux density was 0.6 T, and the effect of the adjacent bus bar was 1.6%. In Example 3, the current that flows until magnetic saturation was reached was about 2.5 times that of the comparative example. This showed that the configuration of Example 3 in which the vertical size is smaller than that of Example 1 (the first embodiment) allowed expanding the current measurement range and amplifying the magnetic field generated by the current to be measured flowing through the bus bar 331 with the first shield 341, the second shield 342, and the third shield 343 serving as a yoke while sufficiently reducing the effect of external magnetic fields including a magnetic field generated by the current flowing through the adjacent bus bar.

Fourth Embodiment

Figure 8:
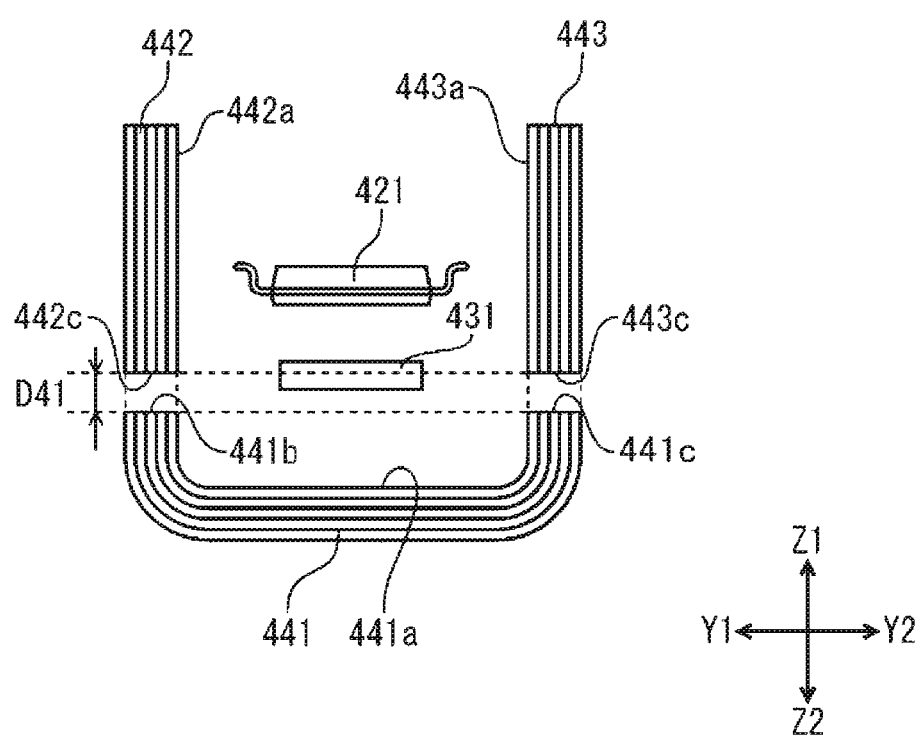
FIG. 8 is an enlarged front view of a bus bar, a magnetic sensor corresponding thereto, and a first shield, a second shield, and a third shield surrounding them in a fourth embodiment illustrating the arrangement thereof.

In a fourth embodiment shown in FIG. 8, the vertically extending portions at the right and left of the top-open U-shaped shield as viewed from the front are divided. This forms a first shield 441 facing a bus bar 431 in the vertical direction (first direction) and a second shield 442 and a third shield 443 extending in the vertical direction and facing each other in the lateral direction. The second opposing surface 442a of the second shield 442 and the third opposing surface 443a of the third shield 443 oppose each other. The right and left opposite ends of the first shield 441 are curved upward with a U-shape curvature, of which the respective upper end faces 441b and 441c oppose the lower surface 442c of the second shield 442 and the lower surface 443c of the third shield 443, respectively, with a distance D41 therebetween. The bus bar 431 is disposed between the magnetic sensor 421 and a first opposing surface 441a, which is the upper surface of the flat portion of the first shield 441, in the vertical direction (Z1-Z2 direction), and the upper and lower surfaces face them, respectively, as in the first embodiment. The other configurations are the same as those of the first embodiment, and a detailed description will be omitted.

Also in the fourth embodiment, the configuration in which the generally U-shaped shield is divided into three as viewed from the front allowed expanding the current measurement range and amplifying the magnetic field generated by the current to be measured flowing through the bus bar 431 with the first shield 441, the second shield 442, and the third shield 443 serving as a yoke while sufficiently reducing the effect of external magnetic fields including a magnetic field generated by the current flowing through the adjacent bus bar.

While the present invention has been described with reference to the embodiments, it is to be understood that the present invention is not limited to the embodiments and can be improved or changed within the object of the improvement or the spirit of the present invention.

The current sensor according to embodiments of the present invention is useful in sufficiently attenuating external magnetic fields and reducing or controlling magnetic saturation.

What is claimed is:

1. A current sensor comprising:
   a magnetic sensor configured to detect a magnetic field generated by a current to be measured flowing through a current path, the magnetic sensor and the current path opposing each other in a first direction perpendicular to an extending direction of the current path; and
   a shielding arrangement including:
      a first shield disposed on an opposite side of the current path from the magnetic sensor in the first direction, the first shield having a first opposing surface facing the current path such that the first direction is normal to the first opposing surface;
      a second shield having a second opposing surface along the first direction; and
      a third shield having a third opposing surface along the first direction,
   wherein the first shield, the second shield, and the third shield are disposed separated from one another, and the second shield and the third shield are separated from the first shield with a respective gap in the first direction and oppose each other in a second direction which is normal to the second opposing surface and the third opposing surface, such that the magnetic sensor and the current path are interposed between the second opposing surface and the third opposing surface.

2. The current sensor according to claim 1, wherein respective ends of the second shield and the third shield adjacent to the first shield are disposed closer to the magnetic sensor in the first direction than the first opposing surface of the first shield is.

3. The current sensor according to claim 2, wherein ends of the first shield in the second direction are disposed adjacent to the second shield and the third shield, respectively, such that the ends of the first shield extend oppositely in the second direction beyond the second opposing surface and the third opposing surface, respectively.

4. The current sensor according to claim 3,
   wherein the extending direction of the current path is a third direction perpendicular to the first direction and the second direction, and
   wherein respective ends of the second shield and the third shield in the third direction are located outside the first shield as viewed from the first direction.

5. The current sensor according to claim 3, wherein the ends of the first shield further extend oppositely in the second direction beyond the second shield and the third shield, respectively.

6. The current sensor according to claim 2, wherein the respective ends of the second shield and the third shield are separated from the first opposing surface by a first distance.

* * * * *